US008981861B2

United States Patent
Zhang et al.

(10) Patent No.: US 8,981,861 B2
(45) Date of Patent: Mar. 17, 2015

(54) INJECTION LOCKED PULSED OSCILLATOR

(71) Applicant: Hittite Microwave Corporation, Chelmsford, MA (US)

(72) Inventors: Cemin Zhang, Nashua, NH (US); Christopher T. Lyons, Tyngsboro, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 78 days.

(21) Appl. No.: 13/827,225

(22) Filed: Mar. 14, 2013

(65) Prior Publication Data

US 2013/0328633 A1   Dec. 12, 2013

Related U.S. Application Data

(60) Provisional application No. 61/657,210, filed on Jun. 8, 2012.

(51) Int. Cl.
  *H03L 7/24*   (2006.01)
  *H03B 5/12*   (2006.01)
  *H03L 7/00*   (2006.01)

(52) U.S. Cl.
  CPC ... *H03L 7/00* (2013.01); *H03L 7/24* (2013.01)
  USPC .................. 331/117 R; 331/114; 331/173

(58) Field of Classification Search
  CPC .. H03B 19/00; H03B 2200/0074; H03B 5/12; H03B 5/1228; H03B 5/1218; H03L 7/24; H03L 7/00

USPC ...... 331/46, 47, 55, 172, 173, 117 R, 117 FE, 331/167, 114

See application file for complete search history.

(56) References Cited

U.S. PATENT DOCUMENTS

| 7,965,150 | B2 * | 6/2011 | Kobayashi et al. | 331/185 |
|---|---|---|---|---|
| 8,008,981 | B2 * | 8/2011 | Hong et al. | 331/173 |
| 2013/0169372 | A1 * | 7/2013 | Kawano et al. | 331/113 R |
| 2014/0104010 | A1 * | 4/2014 | Chen et al. | 331/117 FE |

OTHER PUBLICATIONS

El-Gabaly et al., "A quadrature pulse generator for short-range UWB vehicular radar applications using a pulsed oscillator and a variable attenuator." Circuits and Systems I: Regular Papers, IEEE Transactions on 58.10 (2011): 2285-2295.*

* cited by examiner

*Primary Examiner* — Ryan Johnson
(74) *Attorney, Agent, or Firm* — Knobbe, Martens, Olson & Bear, LLP

(57) ABSTRACT

An injection locked pulsed oscillator includes a voltage controlled oscillator (VCO) responsive to an injection signal. The injection locked pulsed oscillator includes at least one enable circuit responsive to a first enable signal to enable output pulses from the VCO. The injection locked pulsed oscillator also includes timing circuit responsive to a pulse repetition frequency signal and is configured to provide the injection signal to phase lock the VCO and provide the first enable signal delayed from the injection signal to shape a width of the output pulses from the VCO.

27 Claims, 11 Drawing Sheets

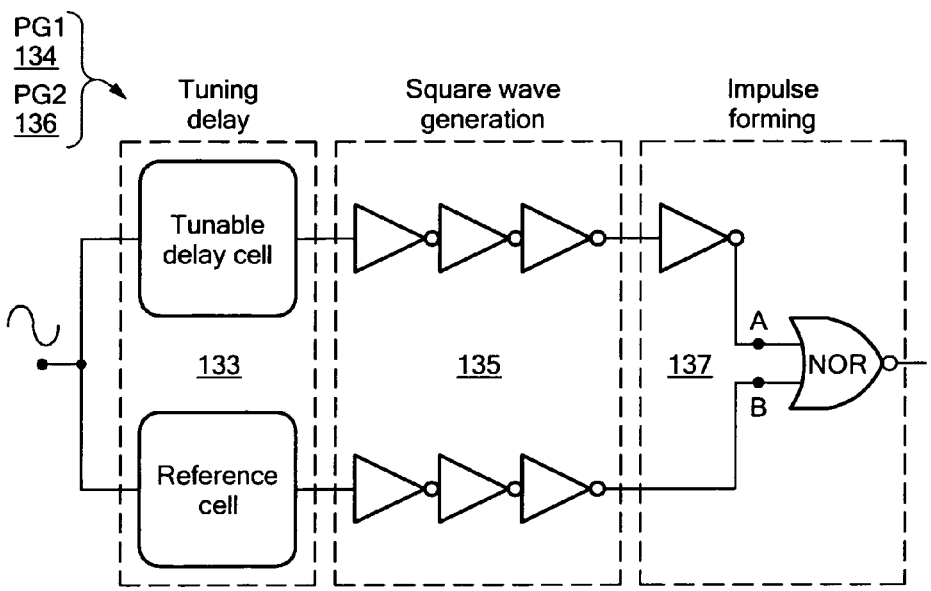
FIG. 4
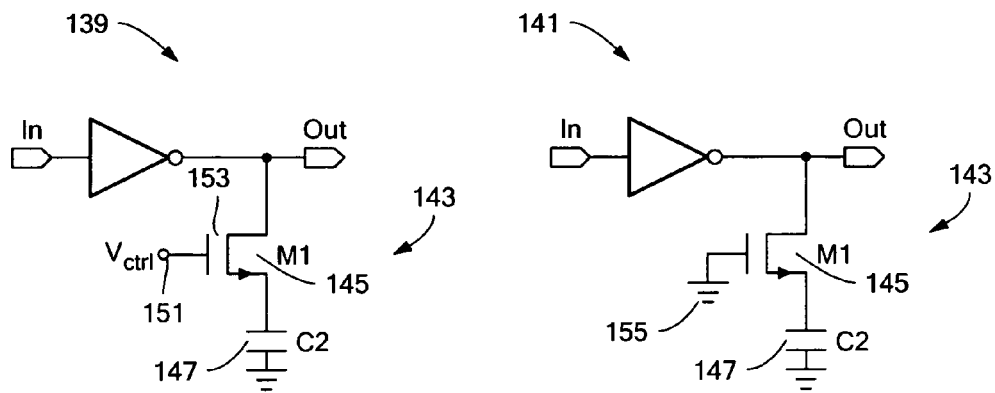
FIG. 5A          FIG. 5B

INJECTION LOCKED PULSED OSCILLATOR

RELATED APPLICATIONS

This application claims benefit of and priority to U.S. Provisional Application Ser. No. 61/657,210 filed Jun. 8, 2012 under 35 U.S.C. §§119, 120, 363, 365, and 37 C.F.R. §1.55 and §1.78 which is incorporated herein by this reference.

FIELD OF THE INVENTION

This invention relates to an injection locked pulsed oscillator.

BACKGROUND OF THE INVENTION

A pulse radar determines target range by measuring the round-trip time of a pulsed radio frequency (RF) signal, commonly generated through a pulsed oscillator. Pulse repetition frequency (PRF) defines the rate at which radar pulses are sent into air or space. Pulse radar systems find many useful applications in many harsh industrial scenarios such as mining, quarrying, agriculture, construction and waste, that all use very large machines and plant equipment, which by their very nature pose a danger if they are not managed safely. Blind spots tend to be much larger on these applications and include not only the rear and nearside but also the front, especially with elevated driver positions. The pulsed radar installed in these equipments can help to prevent collisions, reduce accidents, fatalities, and injury. Another industrial application of pulse radar is for tank level measurement, where the highest reliability and precision are demanded. It measures the level of liquids, slurries as well as many solids stored inside the industrial tank. One fast growing area for pulse radar is the automotive anti-collision radar system which could significantly enhance road safety for all road users and pedestrians. They aim to warn drivers of potential collisions and alert them to pedestrians or obstacles in blind spots.

There have been some methods and apparatus in achieving an injection locked pulsed oscillator. For example, U.S. Pat. No. 4,320,360, incorporated by reference herein, discloses an injection locked voltage controlled oscillator (VCO) whose phase can be controlled and changed by a series of pulses applied through an isolating element such as a capacitor. This approach, however, is incapable of switching the VCO on and off and thus suffers from high power consumption.

U.S. Pat. No. 4,683,446, incorporated by reference herein, discloses a injection locked pulsed oscillator comprised of a PRF generator, a pulse shaping network, and a pulsed oscillator, where the pulse shaping network reshape a PRF clock signal with fast rising edge to turn on and off the pulsed oscillator through controlling the base of the oscillator transistor. This approach, however, does not provide the tuning ability for center frequency and pulse width.

Other injection locked pulsed oscillators have been described in the following: D. D. Barras et al., "Low-power ultrawideband wavelets generator with fast start-up circuit", IEEE Trans. Micro. Theory Tech., Vol. 54, No. 5, pp. 2138-2145, March 2006; T. A. Phan et al, "Energy-efficient low-complexity CMOS pulse generator for multiband UWB impulse radio", IEEE Trans. Circuits Syst. I, Vol. 55, No. 11, pp. 3552-3563, December 2008; N. Deparis et al, "A 2 pJ/bit pulsed ILO UWB transmitter at 60 GHz in 65-nm CMOS-SOI", in Proc. IEEE Int. Conf. Ultra-Wideband, Vancouver, BC, Canada, pp. 113-117, Sep. 9-11, 2009; all of which are incorporated by reference herein.

SUMMARY OF THE INVENTION

One or more embodiments of this invention relates to a pulsed oscillator and in one example to a harmonically injection-locked pulsed oscillator that may be used in pulse radar systems. Preferably, the pulsed oscillator may be locked in phase relative to a precise PRF clock (or its harmonics), since under the phase locked condition, the jitter of the pulsed oscillator output signal is substantially reduced, corresponding to a minimized ranging error for pulse radar system. A timing circuit may provide both injection signals to phase lock the oscillator and enable control pulses to turn the oscillator on and off. The pulsed oscillator may be capable of electronically adjusting both pulse width and center frequency to provide control of the frequency spectrum of the oscillator output signal. Preferably, negligible power is consumed during the OFF cycle of the pulsed oscillator. A push-push type oscillator may be used since the injection signal (or its harmonics) may only be required to lock at half of the oscillator output frequency.

In one aspect, an injection locked pulsed oscillator is featured. The injection locked pulsed oscillator includes a VCO responsive to an injection signal. The injection locked pulsed oscillator also includes at least one enable circuit responsive to a first enable signal to enable output pulses from the VCO. The injection locked pulsed oscillator also includes timing circuit responsive to a pulse repetition frequency signal and configured to provide the injection signal to phase lock the VCO and provide the first enable signal delayed from the injection signal to shape a width of the output pulses from the VCO.

In one embodiment, the timing circuit may include an injection signal generator configured to provide the injection signal and a first pulse generator configured to provide the first enable signal. The VCO may include a push-push VCO. The VCO may include a resonator and first and second negative resistance circuits responsive to the resonator. The first and second negative resistance circuits each may include an enable circuit responsive to the first enable signal. The VCO may be responsive to a control signal and may be configured to tune the center frequency of the VCO. The injection locked pulsed oscillator may include a buffer circuit responsive to the VCO. The timing circuit may include a second pulse generator configured to provide a second enable signal. The buffer circuit may include a buffer enable circuit responsive to the second enable signal configured to enable the buffer circuit. The first and second enable signals each may include a pulse. The second enable pulse may start before and finishes after the first enable signal. One of the harmonic components of the injection signal phase may lock to approximately half the center frequency of the output signal of the push-push VCO. The injection signal may include a fast leading-edge step signal.

In another aspect, an injection locked pulsed oscillator is featured. The injection locked pulsed oscillator includes push-push VCO. The injection locked pulsed oscillator also includes a resonator responsive to an injection signal and first and second negative resistance circuits each having an enable circuit responsive to a first enable signal to enable output pulses from the VCO. The injection locked pulsed oscillator further includes a timing circuit responsive to a pulse repetition frequency signal and includes an injection signal generator configured to provide the injection signal to phase lock the VCO and a first pulse generator configured to provide the first enable signal delayed from the injection signal to shape a width of the output pulses from the VCO.

In one embodiment, the VCO may be responsive to a control signal and may be configured to tune the center frequency of the VCO. The injection locked pulsed oscillator may include a buffer circuit responsive to the VCO. The timing circuit may include a second pulse generator configured to provide a second enable signal. The buffer circuit may include a buffer enable circuit responsive to the second enable signal and configured to enable the buffer circuit. The first and second enable signals may each include a pulse. The second enable pulse may start before and finishes after the first enable pulse. One of the harmonic components of the injection signal phase may lock to approximately half a frequency of the output signal of the push-push VCO. The injection signal may include a fast leading-edge step signal of longer duration than the first enable signal. Each negative resistance circuit may include an oscillator having a control terminal and each enable circuit may include first and second complementary transistors each having a control terminal responsive to the first enable signal, the first transistor coupled between a power supply and the control terminal of the oscillator and configured to charge and enable the oscillator, the second transistor coupled between a ground and the control terminal of the oscillator and configured to discharge and disable the oscillator. The buffer circuit may include a control terminal and the buffer enable circuit may include first and second complementary transistors each having a control terminal responsive to the second enable signal, the first transistor coupled between a power supply and the control terminal of the buffer and configured to enable the buffer, the second transistor coupled between a ground and the control terminal of the buffer and configured to disable the buffer.

In another aspect, a method for phase locking an injection locked pulsed oscillator is featured. The method includes providing a VCO responsive to an injection signal and having at least one enable circuit responsive to a first enable signal to enable output pulses from the VCO, and, in response to a pulse repetition frequency signal, providing the injection signal to the VCO to phase lock the VCO and providing the first enable signal delayed from the injection signal to shape a width of the output pulses from the VCO.

In one embodiment, the method may include providing a buffer circuit responsive to the VCO including a buffer enable circuit, and in further response to a pulse repetition frequency signal, providing the buffer enable circuit with a second enable signal to enable the buffer circuit. The second enable pulse may start before and finishes after the first enable pulse. The injection signal may be a balanced signal applied differentially to the VCO. The injection signal may be a single-ended signal.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 4 is a circuit diagram showing in further detail one example of the tunable pulse generator shown in FIG. 3;

FIG. 5 is a circuit diagram showing in further detail one example of the tuning delay cell shown in FIG. 4;

DETAILED DESCRIPTION OF THE INVENTION

Figure 1:
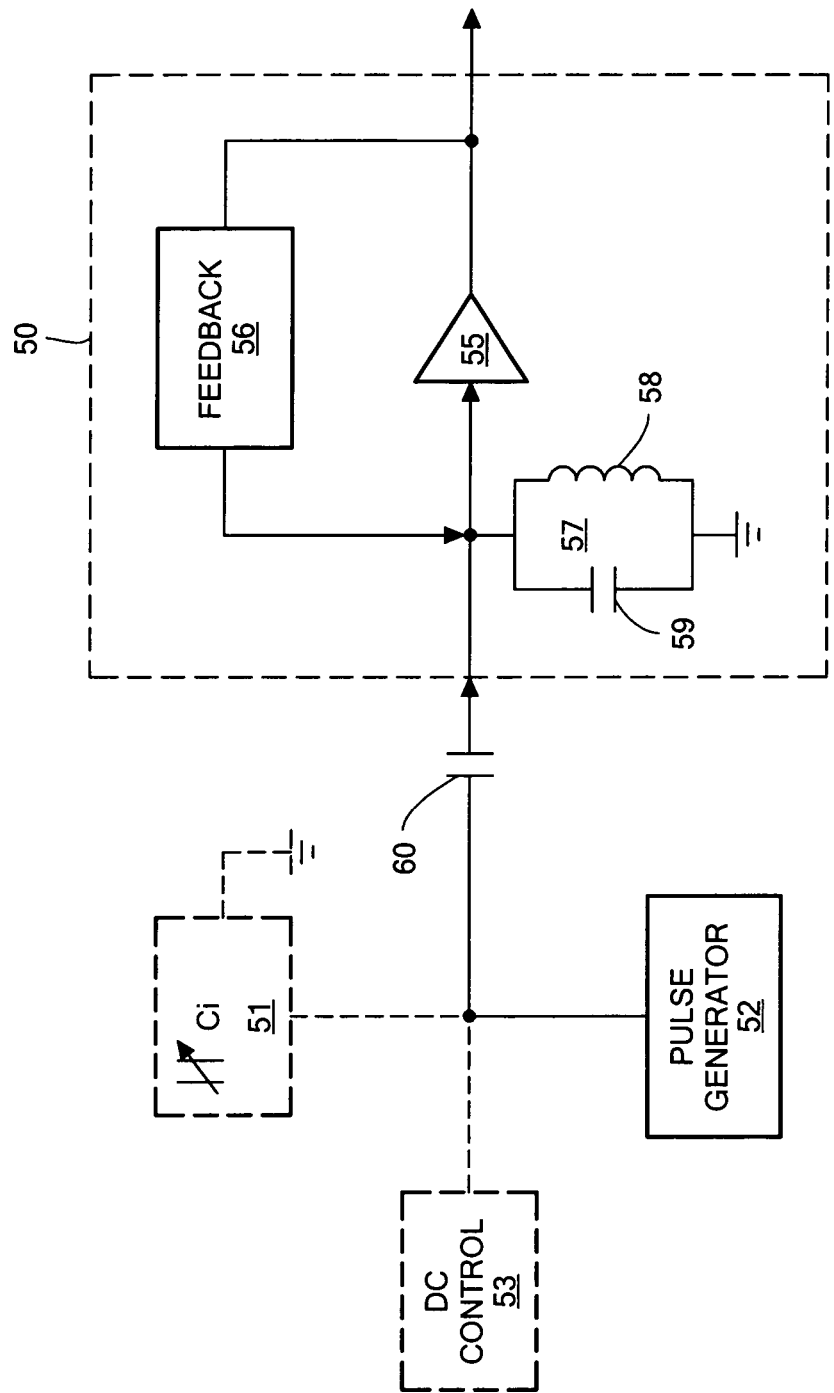
FIG. 1 is a circuit diagram of a conventional pulse injected phase locked oscillator.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section, U.S. Pat. No. 4,320,360 discloses a conventional injection locked VCO in which the phase can be controlled and changed by a series of pulses applied through an isolating element such as a capacitor. As disclosed therein. VCO 50, FIG. 1, in the form of a tuned feedback circuit includes direct current amplifier 55 with feedback circuit 56. Feedback circuit 56 is controlled by tuned tank circuit 57 having inductance 58 in parallel with capacitance 59. Current injection means 52, in the form of a pulse generator selectively applies a current pulse to the input of control means 51. The current pulse selectively distorts the waveform of VCO 50 to produce a phase shift in the output of the VCO. This approach, however, is incapable of switching the VCO on and off and thus suffers from high power consumption.

Figure 2:
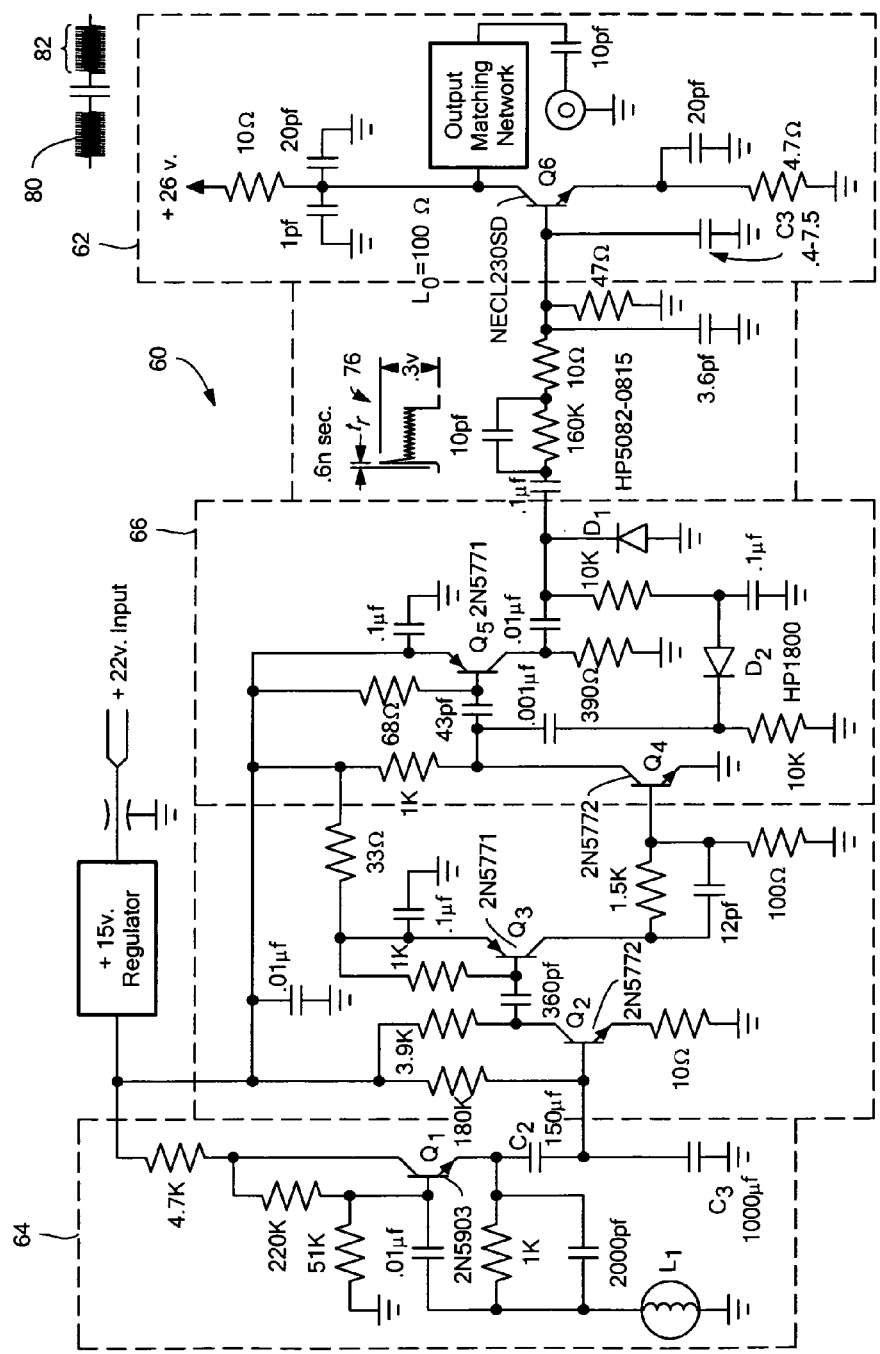
FIG. 2 is a circuit diagram of another conventional injection locked pulsed oscillator.

U.S. Pat. No. 4,683,446 discloses injection locked pulsed oscillator 60, FIG. 2, comprised of PRF generator 64, a pulse shaping network 66, and pulsed oscillator 62 where the pulse shaping network 66 reshapes the PRF clock signal with fast rising edge to turn on and off pulsed oscillator 60 by controlling the base of the oscillator transistor. This approach, however, does not provide the tuning ability for center frequency and pulse width.

Figure 3:
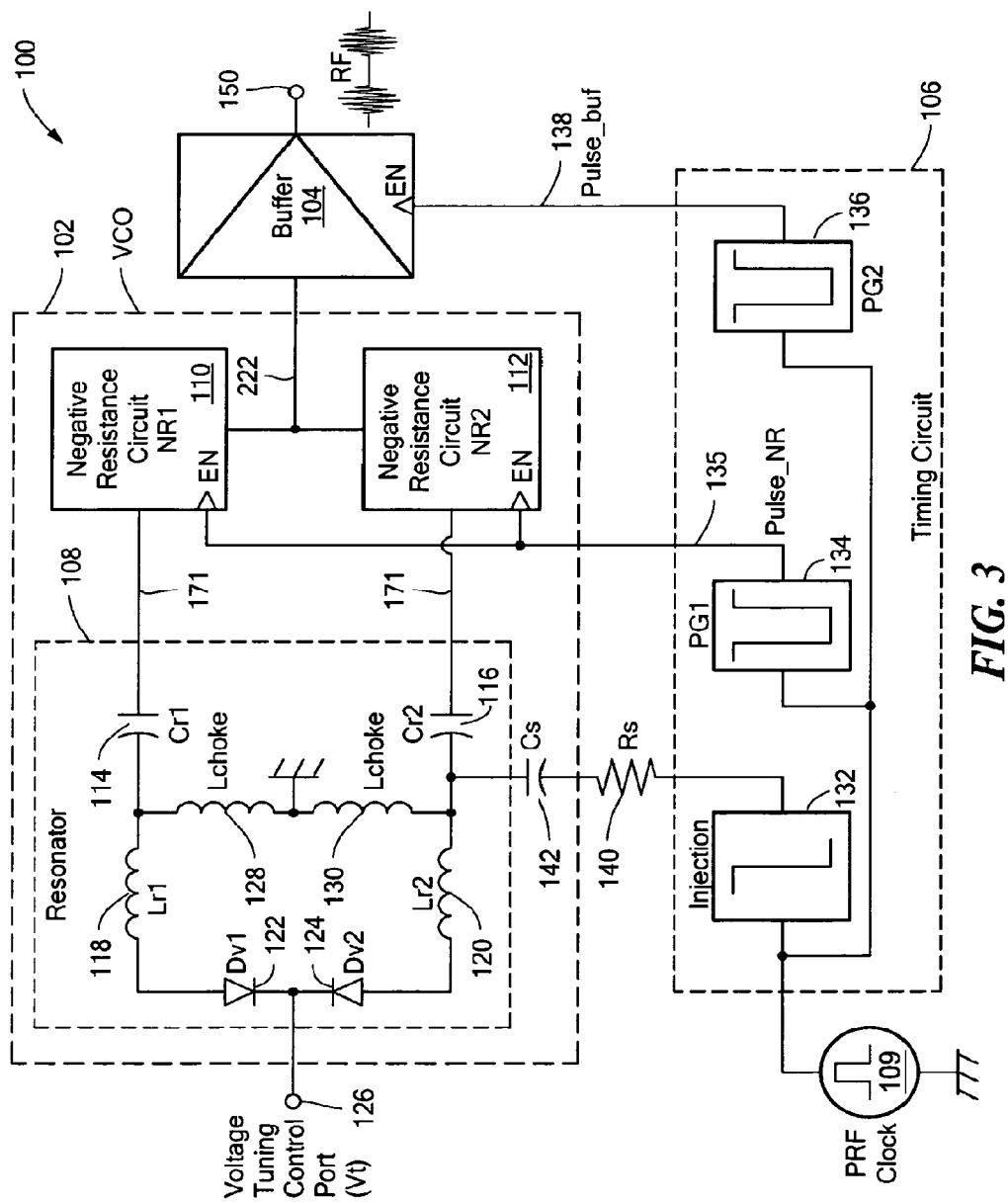
FIG. 3 is a block diagram of one embodiment of the injection locked pulsed oscillator in accordance with this invention.

There is shown in FIG. 3 one embodiment of injection locked pulsed oscillator 100 of this invention. Injection locked pulsed oscillator 100 includes VCO 102 with ON/OFF enable, e.g., a push-push type VCO. Injection locked pulsed oscillator 100 also includes VCO buffer 104 with ON/OFF enable, and timing circuit 106, e.g., sequential timing distribution circuit, triggered by external PRF clock 109. VCO 102 includes a resonator 108 and first and second negative resistance circuits, NR1-110 and NR2-112. Resonator 108 includes capacitors Cr1-114 and Cr2-116, inductors Lr1-118 and Lr2-120, and electrically tunable capacitors, e.g. varactors, Dv1-122 and Dv2-124. Preferably, Cr1-114 and Cr2-116, Lr1-118 and Lr2-120, and Dv1-122 and Dv2-124 are symmetrical. Resonator 108 also includes inductors Lchoke-128 and Lchoke-130 which provide DC ground for varactors Dv1-122 and Dv2-124. Voltage controlling port Vt-126 adjusts the center frequency of VCO 102.

Timing circuit 106 preferably includes injection signal generator 132, tunable pulse generator PG1-134 that produces pulse train 'pulse_NR'-135 to switch NR1-110 and NR2-112 ON and OFF and tunable pulse generator PG2-136 that produces pulse train 'pulse_buf'-138 to switch VCO 104 buffer ON and OFF.

FIG. 4 shows one example of the tunable pulse generator PG1-134, PG2-136. Tunable pulse generator PG1-134, PG2-136 preferably includes a tuning delay circuit 133, square-wave generator 135, an impulse-forming circuit 137, and a pulse-shaping circuit.

Tuning delay circuit 133 preferably includes a pair of parallel tunable delay cells 139, 141, FIG. 5, each preferably including reference cell 143 using shunt-capacitor delay elements, e.g., capacitor e-147 as shown. The NMOS transistor M1-145 controls the charging and discharging current to the capacitor C2-147. The only difference between the circuits of the tunable delay cell 139 and reference cell 141 is the gate voltage Vctr1 151 of M1-145, which controls the charge current. For the tunable delay cell 139, variable control voltage is applied to the gate 153 to produce continuous delay variation. On the other hand, for reference cell 141, the gate voltage is fixed to ground 155, thus the time delay is constant and provides a reference position to the tunable delay cell.

One way to implement the injection signal generator 132, FIG. 3, is to use a series of inverters with increasing size for each step to increase the drive capabilities and shorten the rising and falling times of the injection signal.

Injection signal generator 132 preferably generates PRF-coherent fast leading-edged snapping signals, such as fast steps or narrow pulses, which are injected into resonator 108 through a series RC network, e.g., Rs-140 and Cs-142. The fast-edged PRF-coherent injection signal is rich in higher order harmonic components. Thus, VCO 102 is phase locked to one of the harmonics of the injection signal from injection signal generator 132. Preferably, as discussed above, VCO 102 is a push-push type VCO instead of a fundamental VCO since the injection signal is only required to generate harmonics at near the half of VCO's output frequency. Although VCO 102 is shown as a push-push VCO in FIG. 3, other types of VCOs may be used as known to those skilled in the art, e.g., a cross coupled VCO, a single-ended VCO, or similar type VCO.

The types of injection locking signal generated by injection signal generator 132 may be fast leading-edge step signal or fast pulse signal. The duration of the fast leading-edge step signal is preferably typically longer than the enable signals of VCO 102 or VCO buffer 104. The injection locking signal may be applied to resonator 108 single-endedly or differentially.

The center frequency of RF output 150 may be controlled by electrically tunable capacitors. The electrically tunable capacitors may each include a varactor, e.g., varactors Dv1-122 and Dv2-124. Each of the varactors may include two diodes coupled together in an anode to anode or cathode to cathode (as shown) configuration. Each of the varactors may alternatively include one diode. Each of the varactors may include a pn junction. Each of the varactors may include a field effect transistor (FET) and use the capacitance between a gate and a source of the FET. Each electrically tunable capacitor may include a ferroelectric based capacitor. Each electrically tunable capacitor may include a MEMS-based capacitor.

Figure 6:
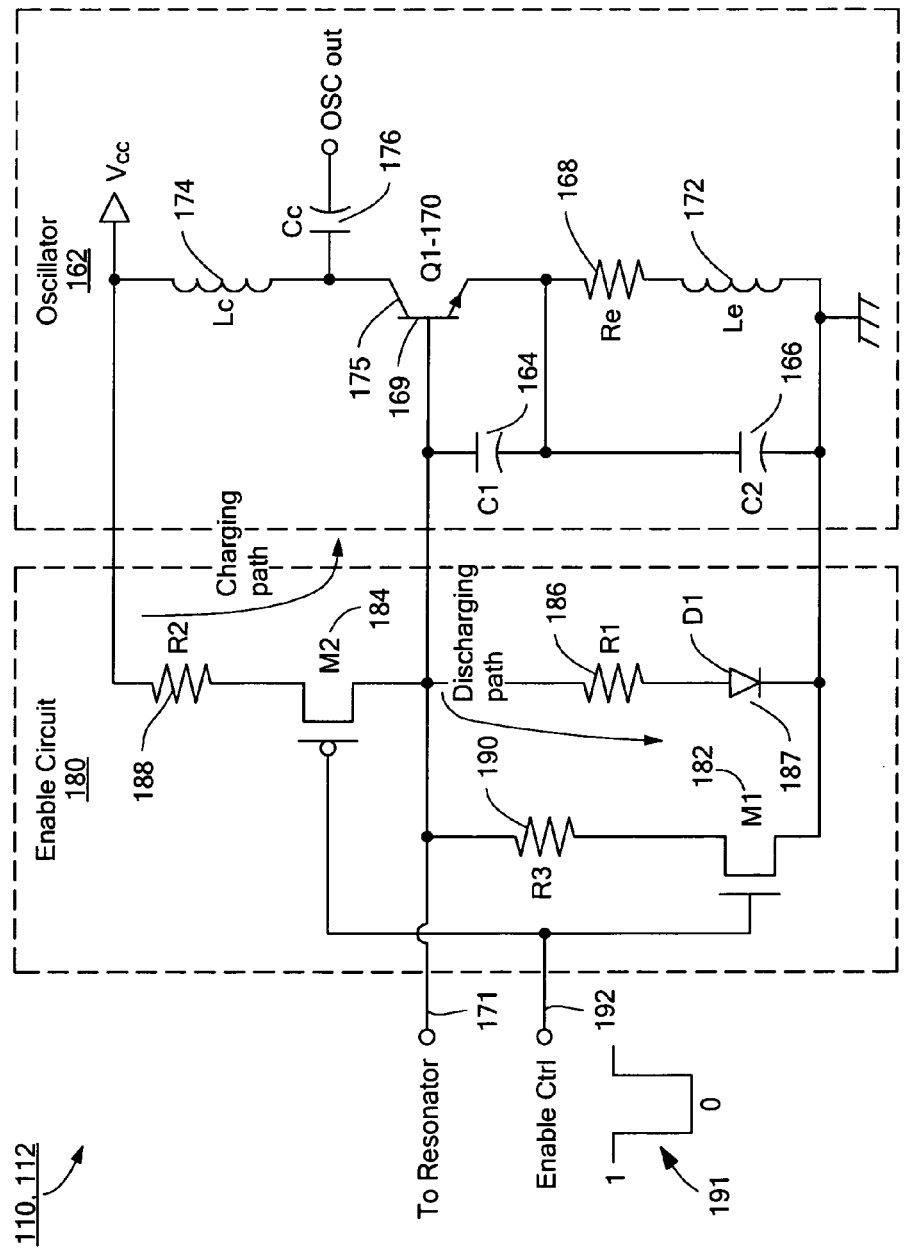
FIG. 6 is a circuit diagram showing in further detail one example of the negative resistance circuits with enable control shown in FIG. 3.

FIG. 6 shows a more detailed example of each of first and second negative resistance circuits 110, 112, FIG. 3, connected to resonator 108. In this example, each of negative resistance circuits 110, 112, FIG. 6, preferably includes oscillator 162, e.g., a Colpitts oscillator or similar type oscillator known to those skilled in the art. Oscillator 162 includes capacitors C1-164 and C2-166 which act as a voltage divider providing a feedback source for oscillator 162. Resistor Re-168 provides proper DC biasing condition for transistor Q1-170. Base 169 of the transistor Q1-170 is connected to resonator 108 FIG. 3 by line 171. Inductor Le-172 provides the inductive emitter degeneration. In one design, the oscillator signal is preferably tapped out between the choke inductor Lc-174 and collector 175 of Q1-170 through a DC blocking capacitor Cc-176. First and second negative resistance circuits 110, 112 also preferably include enable circuit 180. Enable circuit 180 preferably includes Complementary Metal Oxide Semiconductor (CMOS) devices, e.g., M1-182 is a NMOS and M2-184 is a PMOS. In one design, enable circuit 180 includes resistors R1-186, R2-188 and diode D1-187 which provide base bias for transistor Q1-170. Assuming initially the enable control signal 191 input at control port 192 is set at logic high '1', then the NMOS M1-182 is ON and PMOS M2-184 is OFF and the base voltage of transistor Q1-170 is pulled down to near the DC ground and oscillator 162 is thus turned off. When the enable control at 192 is switched to logic low NMOS M1-182 is off and PMOS M2-184 is ON. The current charges base 169 of transistor Q1-170 through resistor R2-188 and PMOS M2-184. After a finite charging time, which may be determined by the value of R2-188, the RC constant of oscillator 162, and the base resistance of Q1-170, transistor Q1-170 is fully turned ON and oscillator 162 is operational. Assuming after a certain period of time the enable control signal 191 is switched back to logic high '1' from logic low '0', NMOS M1-182 is on and PMOS M2-184 is off. Then the current discharges through resistor R3-190 and NMOS M1-182. After a finite discharging time, the base voltage of the transistor Q1-170 is pulled down to near the DC ground and oscillator 162 is turned off. The value of R3-190 is preferably optimized to provide a desired rolling off shape for the pulsed oscillator waveform as well as to provide large enough RF isolation between oscillator 162 and the enable control port 192.

Figure 7:
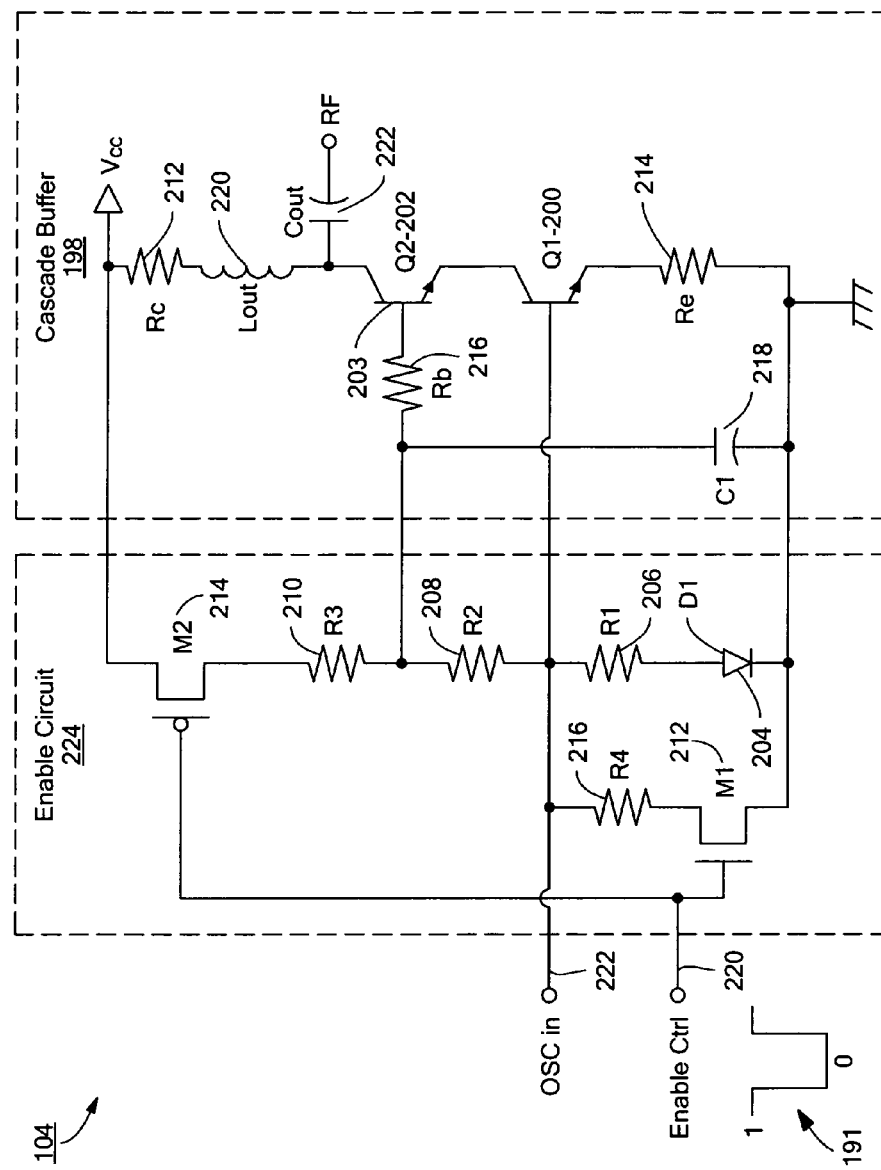
FIG. 7 is a circuit diagram showing in further detail one example of the buffer circuit with enable control shown in FIG. 3.

FIG. 7 shows in further detail one exemplary implementation of VCO buffer circuit 104, FIG. 3, with enable control. Buffer circuit 104, FIG. 7, preferably includes a cascode buffer 198 with input common-emitter (CE) transistor Q1-200 driving output common-base (CB) transistor Q2-202. Diode D1-204, together with resistors R1-206, R2-208, R3-210 of enable circuit 224 and resistor Re-212 set the bias levels for both Q1-200 and Q2-202. Resistor Re-214 is preferably optimized for desired voltage gain and current consumption. Resistor Rb-216 and capacitor C1-218 preferably provide low RF impedance at base 203 of Q2-202, which may help stabilize cascode amplifier. Inductor Lout-220 and capacitor Cout-222 form an output matching network for the desired output frequency. Enable circuit 224 also includes NMOS M1-212 and PMOS M2-214 responsive to enable control signals 191 at enable control port 220 and resistor R4-216. Enable circuit 224 is similar to enable circuit 180, FIG. 6, and switching control mechanism is the same as discussed above. Buffer 104, FIG. 7, is connected to first and second negative resistance circuits 110, 112 by line 222 as shown in FIG. 3.

Figure 8:
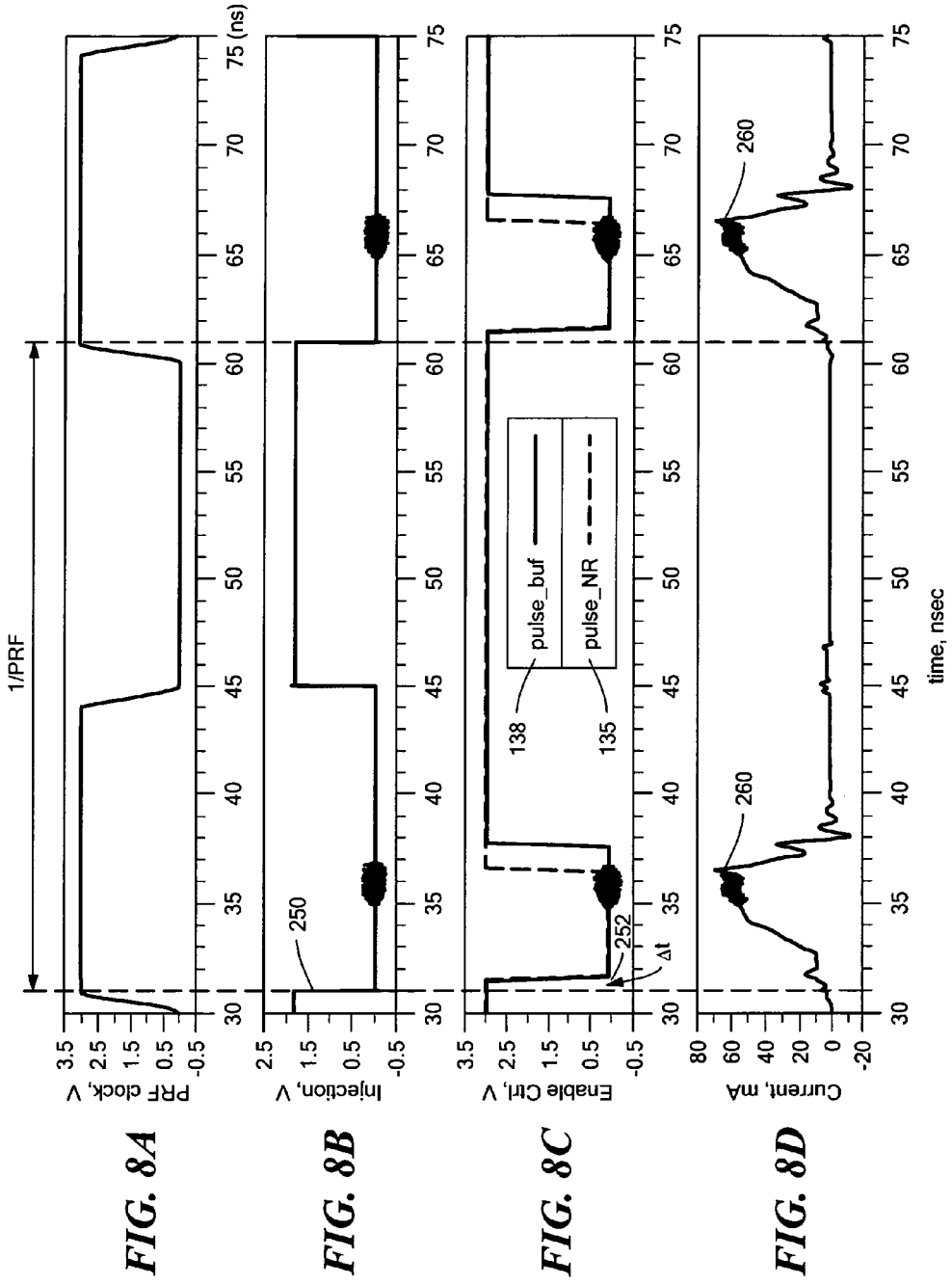
FIGS. 8A-8D depict examples of sequential timing diagrams for the injection locked pulsed oscillator shown in FIGS. 3-7.

FIGS. 8A-8D show exemplary sequential timing diagrams of one embodiment of injection locked pulsed oscillator 100, FIG. 3. FIG. 8A shows one example of the PRF clock output a sequence of square waveforms with a period of 30 ns (i.e. 33.33 MHz). This PRF clock serves as the external triggering clock for timing circuit 106, FIG. 3. In response thereto, as shown in FIG. 8B, injection generator 132, FIG. 3, produces a step signal with a fast falling edge close to 50 ps, indicated at 250, FIG. 8B, which is rich in high frequency harmonic components. One of the higher order harmonic components will phase lock to half frequency of the output of VCO 102, FIG. 3. Generally, a step injection signal is preferred over a pulse injection signal, since in the frequency domain the pulse signal produces more nulls than step signal. If the null regions coincide with the oscillator natural frequency, the injection lock may fail due to lack of injection energy. In addition, a falling edge step is usually preferred over a rising edge step since falling edge step is formed by discharging through an NMOS device with high cut-off frequency, which is faster than the rising edge step formed by charging through a PMOS device with low cut-off frequency. One key feature of injection locked pulsed oscillator 100 of one embodiment of this invention is the delay between the fast-edge(s) of the injection signal and the enabling of VCO 102. As will be described below, this minimizes the power required from the injection signal to lock VCO 102 and/or provides better locking characteristics. This may also lead to more accurate control of the oscillator output pulse width (and thus the bandwidth of the output frequency spectrum) by the VCO enable signal. As shown in FIG. 8C, with a short delay Δt-252 after the injection signal reaching resonator 108, FIG. 3, the enable control signals, 'pulse_NR'-135 and 'pulse_buf'-138 FIG. 8C, are generated from timing circuit 106, which turns ON (or OFF) oscillator 100 and buffer 104 with voltage low (or high). Preferably, 'pulse_buf'-138 is turned low before 'pulse_NR'-135, and turned high after 'pulse_NR'-135. In other words, 'pulse_NR'-135 resides inside of 'pulse_buf'-138, so that the pulse width of the RF output signal at output port 150, FIG. 3, is fully determined by the pulse width of 'pulse_NR'-135. The ability of oscillator 100 to lock onto the injected signal depends on various factors. The injection locking will preferably occur if the following parameters of equation (1) below are met:

$$f_i < f_L = \frac{f_o}{2Q} \cdot \sqrt{\frac{P_i}{P_o}} \cdot \frac{1}{N} \quad (1)$$

where Q is the quality factor of the resonator 108, $f_L$ is the lock range of the oscillator 100, $f_o$ is the natural resonance frequency of the oscillator 100, $f_i$ is the frequency of the PRF clock 109, N is the frequency ratio of $f_o/f_i$ in integer, $P_i$ is the injected power at frequency N·$f_i$, and $P_o$ is the free-running power in resonator 108.

Usually $P_i$ is a small value, especially for oscillator 100 having higher resonance frequency $f_o$, since $P_i$ is the harmonic portion of the injected signal near frequency $f_o$. Because $P_o$ will increase to a considerably large value due to oscillation build up, it may be very difficult to injection lock oscillator 100 when it has started oscillating. It should be emphasized that the fast step signal is preferably injected into resonator 108 with a Δt-252, FIG. 8C, earlier than the oscillator enable signal, to ensure that when injection energy $P_i$ exists in resonator 108, FIG. 3, the $P_o$ is preferably close to zero, which results in equation (1) being satisfied. However, the delay time Δt-252 should not be set too large since the injected energy $P_i$ decays with time. FIG. 8D shows the total current consumption of the whole pulsed oscillator 100, FIG. 3, including the timing circuit 106. The peak current is around 60 mA, indicated at 260, FIG. 8D, during the time when both oscillator 100 and buffer 104 are turned on. The current is negligible when oscillator 100 and buffer 104 are turned off.

Figure 9:
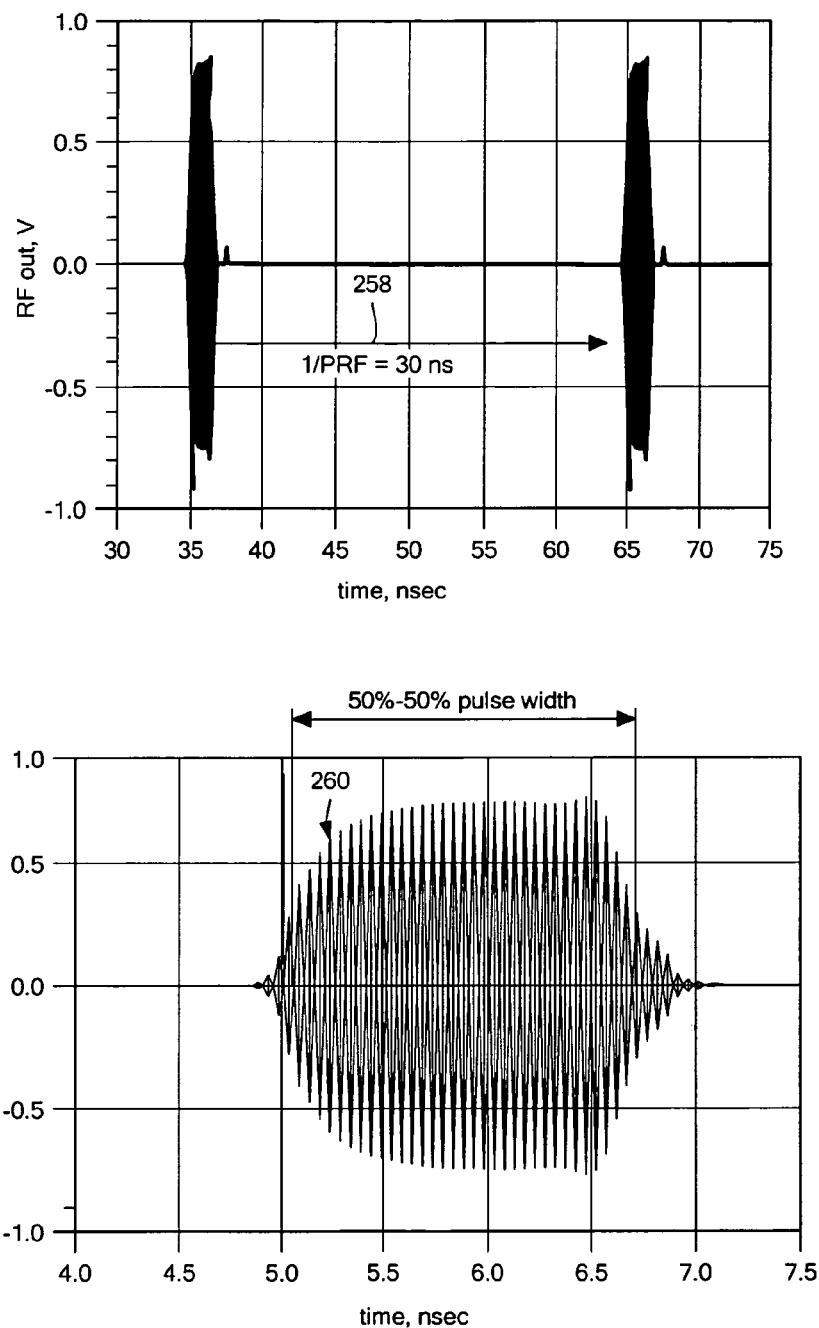
FIG. 9 depicts graphs showing one example of time domain output waveforms for the injection locked pulsed oscillator shown in FIGS. 3-7.

FIG. 9 shows one example of the time domain output waveform of the injection locked pulsed oscillator 100, FIG. 3, with a PRF of 33.33 MHz indicated at 258, FIG. 9. Output waveform 260 on the right shows an example of a more detailed view of the 50%-50% pulse width of the output waveform tunable from 0.3 ns to 6 ns by controlling the pulse width of 'pulse_NR'-135 and 'pulse_buf'-138.

Figure 10:
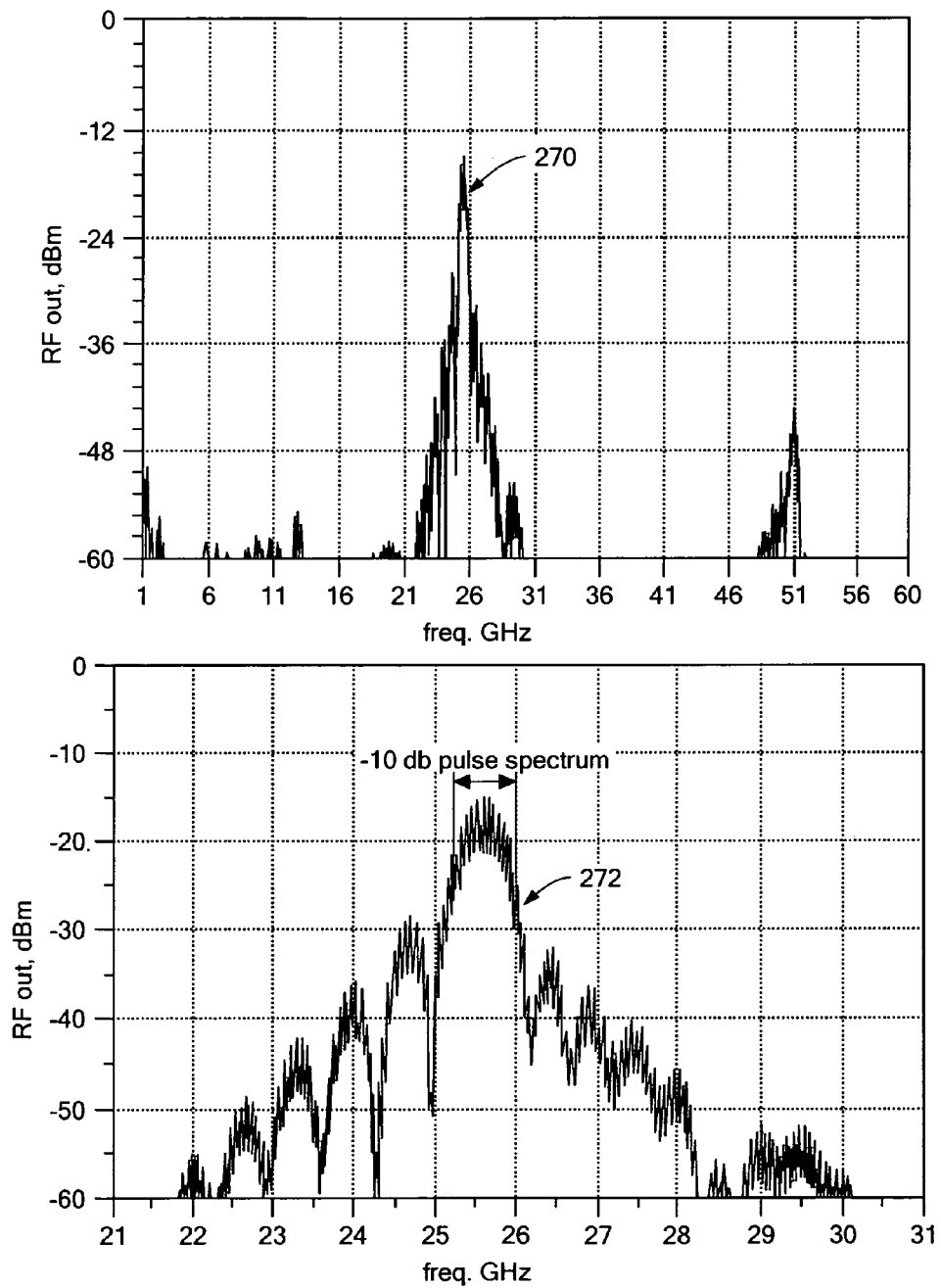
FIG. 10 depicts graphs showing one example of the power spectrum density of the injection locked pulsed oscillator shown in FIGS. 3-7.

FIG. 10 shows one example of the power spectrum density of injection locked pulsed oscillator 100 of one embodiment of this invention. In this example, the RF output is centered at about 25.5 GHz, indicated at 270, and may be adjusted by changing tuning voltage control $V_T$-126, FIG. 3. The −10 dB bandwidth of the RF output shown by plot 272 is reversely proportional to the 50%-50% pulse width therefore may also be adjusted.

Figure 11:
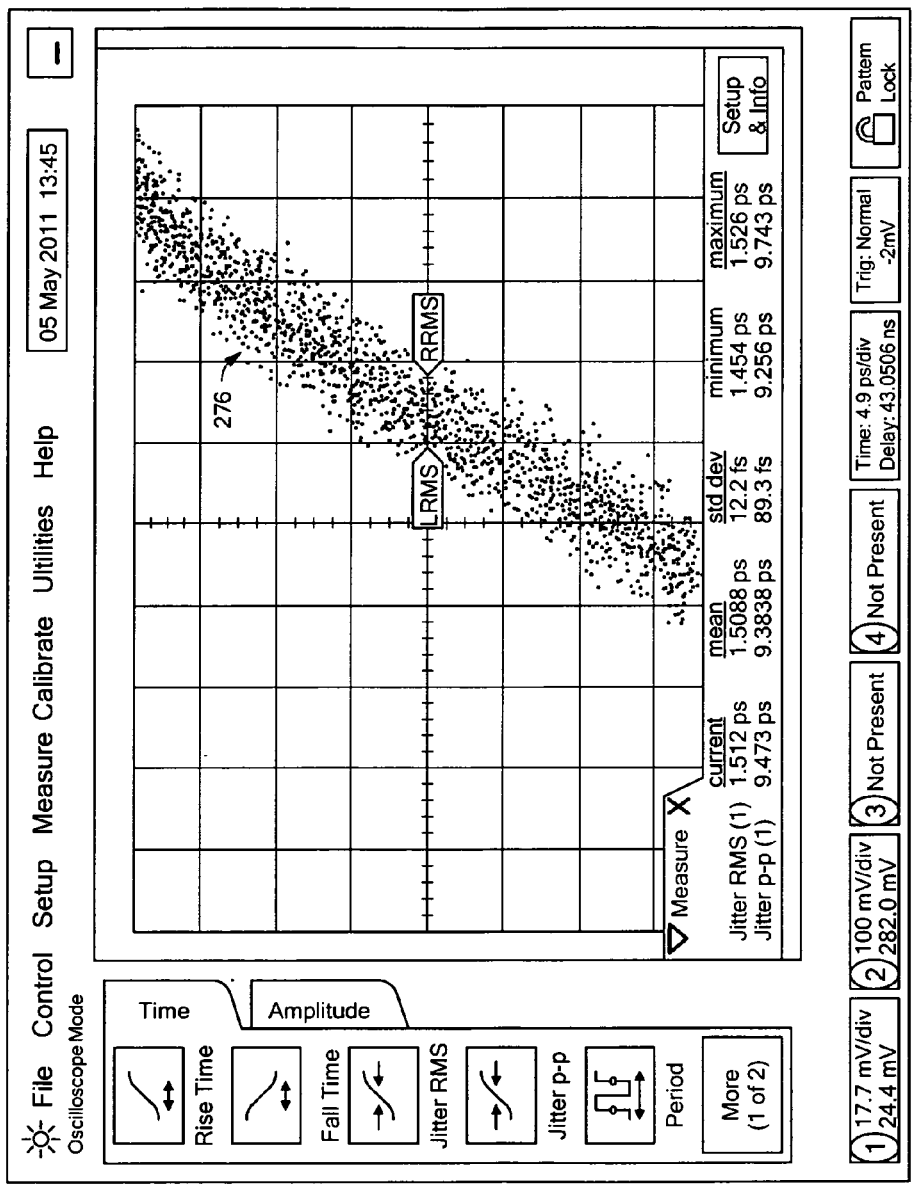
FIG. 11 is a graph showing one example of the output jitter of the injection locked pulsed oscillator shown in FIGS. 3-7.

FIG. 11 shows one example of the output jitter of injection locked pulsed oscillator 100, FIGS. 3-7. As shown at 276, FIG. 9, the measured RMS jitter may be as low as 1.51 ps which demonstrates a good phase locking between PRF clock signal and the pulsed oscillator.

Figure 12:
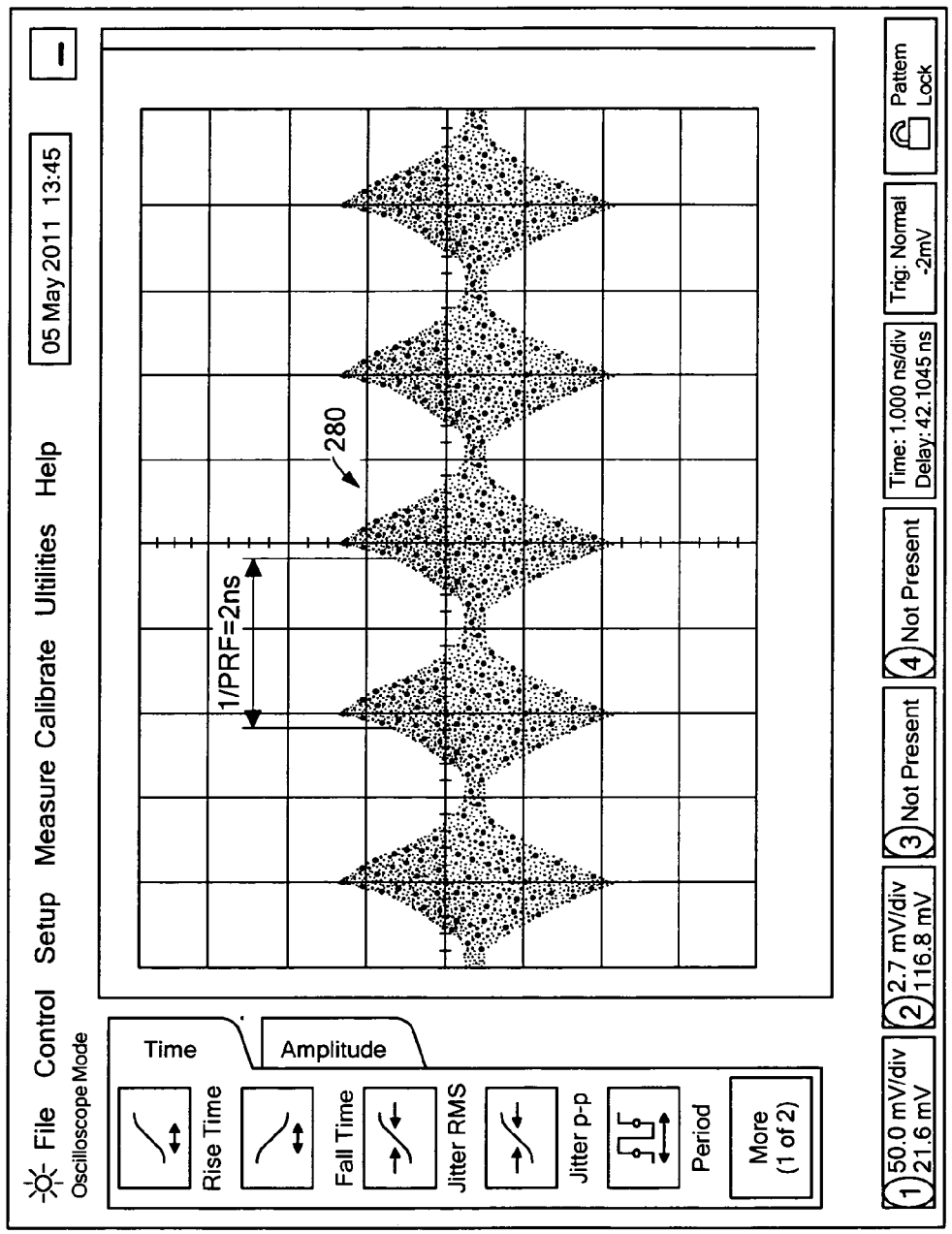
FIG. 12 is a graph showing one example of the measured output pulse train of the injection locked pulsed oscillator shown in FIGS. 3-7.

FIG. 12 shows one example of the measured output pulse train 280 of injection locked pulsed oscillator 100, FIGS. 3-7, which demonstrates one example of On-Off-Key (OOK) modulation at 500 MHz PRF clock rate. Output pulse train 280, FIG. 12, shows that the injection locked pulsed oscillator 100 can also serve as a low-power, low-complexity transmitter that generates high data rate OOK modulated pulses through switching ON/OFF the oscillator and buffer. It should be noted that while the above description assumes a pulse rate frequency clock with a fixed frequency and with the injection locked oscillator locked to a harmonic of that frequency, one or more embodiment of this invention may also be used in systems where the period of the pulse rate frequency clock varies over time. In this case, one or more embodiment of the injection locked pulsed oscillator of this invention may provide stable timing between the leading edge of the clock and the zero crossings of the output RF carrier and pulse envelope waveform.

The circuits disclosed herein for injection locked pulsed oscillator 100, FIGS. 3-7, may be implemented on a planar monolithic substrate. The monolithic substrate may be Silicon, SiGe, GaAs, or similar type substrates. The monolithic substrate may be mounted on a surface-mount package.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An injection locked pulsed oscillator comprising:
a voltage controlled oscillator (VCO) responsive to an injection signal including at least one enable circuit responsive to a first enable signal to enable output pulses from the VCO; and
a timing circuit responsive to a pulse repetition frequency signal and configured to provide the injection signal to phase lock the VCO and provide the first enable signal delayed from the injection signal to shape a width of the output pulses from the VCO.

2. The injection locked pulsed oscillator of claim 1 in which the timing circuit includes an injection signal generator configured to provide the injection signal and a first pulse generator to provide the first enable signal.

3. The injection locked pulsed oscillator of claim 1 in which the VCO includes a push-push VCO.

4. The injection locked pulsed oscillator of claim 3 in which the VCO includes a resonator and first and second negative resistance circuits responsive to the resonator.

5. The injection locked pulsed oscillator of claim 4 in which the first and second negative resistance circuits each include an enable circuit responsive to the first enable signal.

6. The injection locked pulsed oscillator of claim 1 in which the VCO is responsive to a control signal and configured to tune the center frequency of the VCO.

7. The injection locked pulsed oscillator of claim 1 further including a buffer circuit responsive to the VCO.

8. The injection locked pulsed oscillator of claim 7 in which the timing circuit further includes a second pulse generator configured to provide a second enable signal and the buffer circuit includes a buffer enable circuit responsive to the second enable signal and configured to enable the buffer circuit.

9. The injection locked pulsed oscillator of claim 8 in which the first and second enable signals each include a pulse.

10. The injection locked pulsed oscillator of claim 9 in which the second enable pulse starts before and finishes after the first enable signal.

11. The injection locked pulsed oscillator of claim 3 in which one of the harmonic components of the injection signal phase locks to approximately half the center frequency of the output signal of the push-push VCO.

12. The injection locked pulsed oscillator of claim 1 in which the injection signal includes a fast leading-edge step signal.

13. An injection locked pulsed oscillator comprising:
a push-push voltage controlled oscillator (VCO) including a resonator responsive to an injection signal and first and second negative resistance circuits each having an enable circuit responsive to a first enable signal to enable output pulses from the VCO; and
a timing circuit responsive to a pulse repetition frequency signal including:
an injection signal generator configured to provide the injection signal to phase lock the VCO, and
a first pulse generator configured to provide the first enable signal delayed from the injection signal to shape a width of the output pulses from the VCO.

14. The injection locked pulsed oscillator of claim 13 in which the VCO is responsive to a control signal and configured to tune the center frequency of the VCO.

15. The injection locked pulsed oscillator of claim 14 further including a buffer circuit responsive to the VCO.

16. The injection locked pulsed oscillator of claim 15 in which the timing circuit further includes a second pulse generator configured to provide a second enable signal and the buffer circuit includes a buffer enable circuit responsive to the second enable signal and configured to enable the buffer circuit.

17. The injection locked pulsed oscillator of claim 16 in which the first and second enable signals each include a pulse.

18. The injection locked pulsed oscillator of claim 17 in which the second enable pulse starts before and finishes after the first enable pulse.

19. The injection locked pulsed oscillator of claim 13 in which one of the harmonic components of the injection signal phase locks to approximately half the center frequency of the output signal of the push-push VCO.

20. The injection locked pulsed oscillator of claim 13 in which the injection signal includes a fast leading-edge step signal of longer duration than the first enable.

21. The injection locked pulsed oscillator of claim 13 in which each negative resistance circuit includes an oscillator having a control terminal and each enable circuit includes:
first and second complementary transistors each having a control terminal responsive to the first enable signal, the first transistor coupled between a power supply and the control terminal of the oscillator and configured to charge and enable the oscillator, the second transistor coupled between a ground and the control terminal of the oscillator and configured to discharge and disable the oscillator.

22. The injection locked pulsed oscillator of claim 16 in which the buffer circuit includes a control terminal and the buffer enable circuit includes:
first and second complementary transistors each having a control terminal responsive to the second enable signal, the first transistor coupled between a power supply and the control terminal of the buffer and configured to enable the buffer, the second transistor coupled between a ground and the control terminal of the buffer and configured to disable the buffer.

23. A method for phase locking an injection locked pulsed oscillator, the method comprising:
providing a voltage controlled oscillator (VCO) responsive to an injection signal and having at least one enable circuit responsive to a first enable signal to enable output pulses from the VCO; and
in response to a pulse repetition frequency signal, providing the injection signal to the VCO to phase lock the VCO, and providing the first enable signal delayed from the injection signal to shape a width of the output pulses from the VCO.

24. The method of claim 23 further including:
providing a buffer circuit responsive to the VCO and including a buffer enable circuit; and in further response to a pulse repetition frequency signal, providing the buffer enable circuit with a second enable signal to enable the buffer circuit.

25. The method of claim 24 in which the second enable pulse starts before and finishes after the first enable pulse.

26. The method of claim 23 in which the injection signal is a balanced signal applied differentially to the VCO.

27. The method of claim 23 in which the injection signal is a single-ended signal.

* * * * *